United States Patent [19]

Sasaki et al.

[11] Patent Number: 4,532,494
[45] Date of Patent: Jul. 30, 1985

[54] ADAPTIVE DELTA CODEC WHICH VARIES A DELTA SIGNAL IN ACCORDANCE WITH A CHARACTERISTIC OF AN INPUT ANALOG SIGNAL

[75] Inventors: Itsuo Sasaki, Kawasaki; Hiroaki Suzuki, Yokohama; Masakazu Kamichika, Kawasaki, all of Japan

[73] Assignee: Tokyo Shibaura Denki Kabushiki Kaisha, Kawasaki, Japan

[21] Appl. No.: 335,652

[22] Filed: Dec. 30, 1981

[30] Foreign Application Priority Data

Jan. 9, 1981 [JP] Japan .................................. 56-1985
Jan. 9, 1981 [JP] Japan .................................. 56-1986
Jan. 19, 1981 [JP] Japan .................................. 56-6174

[51] Int. Cl.³ ............................................. H03K 13/02
[52] U.S. Cl. ............................ 340/347 AD; 332/11 D; 375/28; 340/347 M
[58] Field of Search ................... 340/347 AD, 347 M; 375/28–33; 332/11 D

[56] References Cited

U.S. PATENT DOCUMENTS 3,296,612 1/1967 Tomozawa .................. 375/27 X
3,631,520 12/1971 Atal .................................. 375/27 X
3,971,987 7/1976 Carrubba et al. ............... 375/31
4,107,610 8/1978 Weber ............................. 375/27

FOREIGN PATENT DOCUMENTS 0031450 11/1980 European Pat. Off. .
300050 4/1982 European Pat. Off. .

OTHER PUBLICATIONS

Conference Record, 1978 International Conference on Communications, vol. 1, 1978, pp. 8.3.1–8.3.5.

Primary Examiner—T. J. Sloyan
Attorney, Agent, or Firm—Finnegan, Henderson, Farabow, Garrett & Dunner

[57] ABSTRACT

A delta value generating circuit in an adaptive delta codec, comprising a delta value register, a control terminal for indicating increase or decrease of the delta value and adder/subtractor for increasing or decreasing the delta value in the register in accordance with a level at the control terminal. The adder/subtractor has first input terminals connected to the output terminals of the register and second input terminals connected to a predetermined number of upper bits of the output terminals of the register and the control terminal in accordance with a level at the control terminal.

2 Claims, 18 Drawing Figures

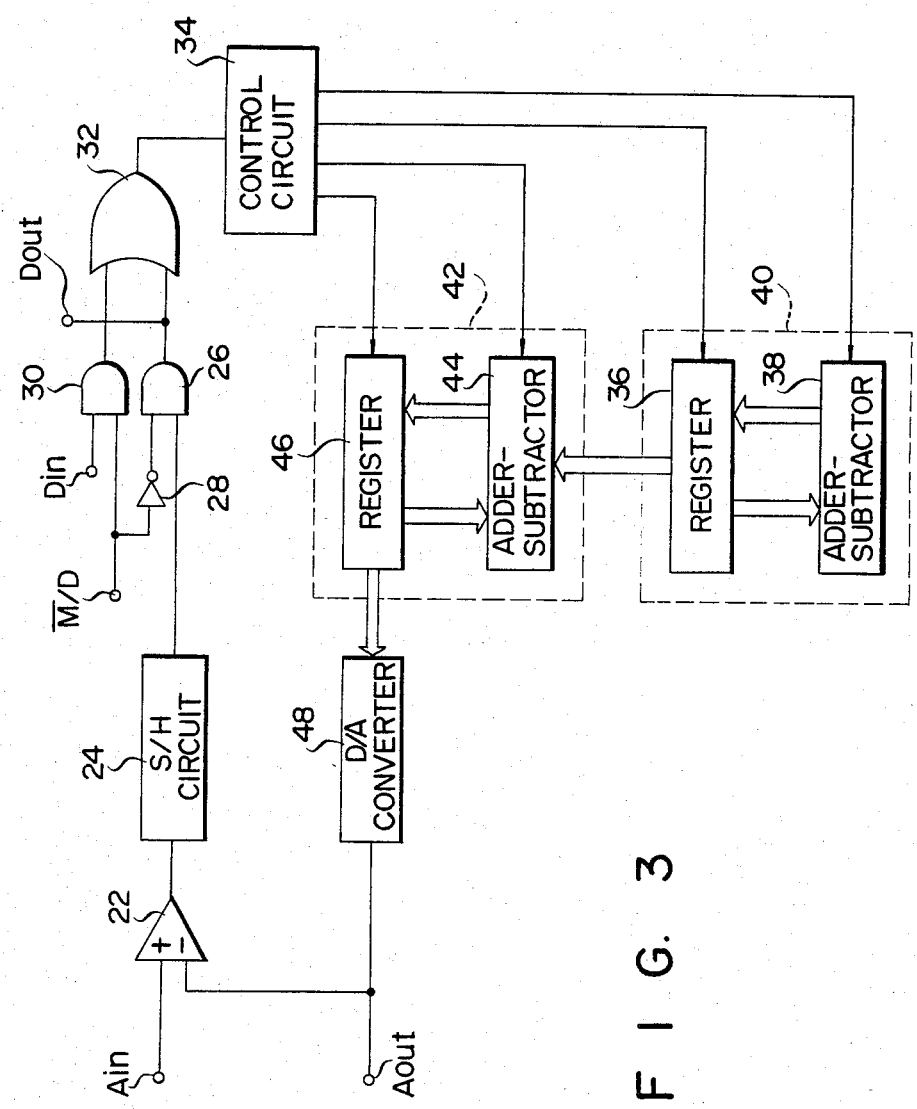
F I G. 3

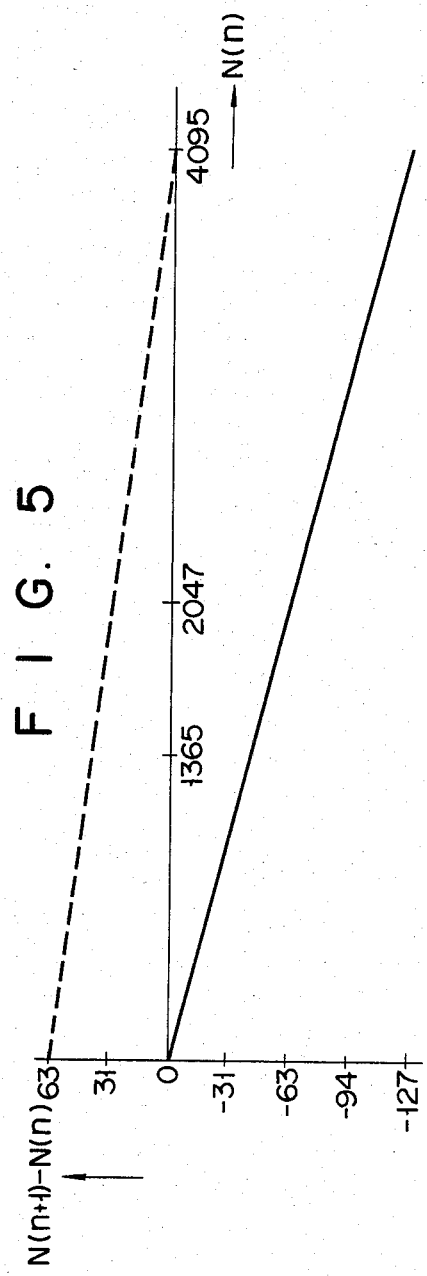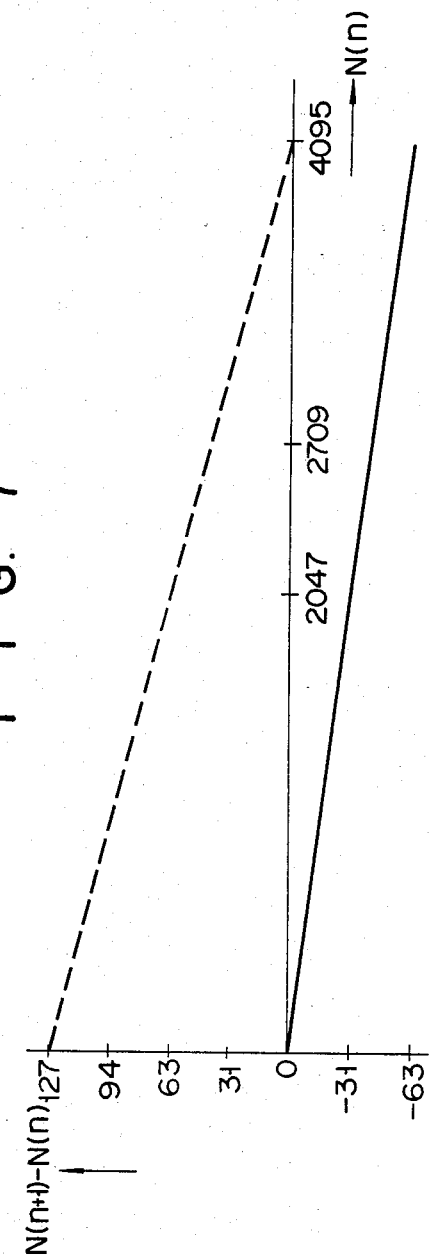

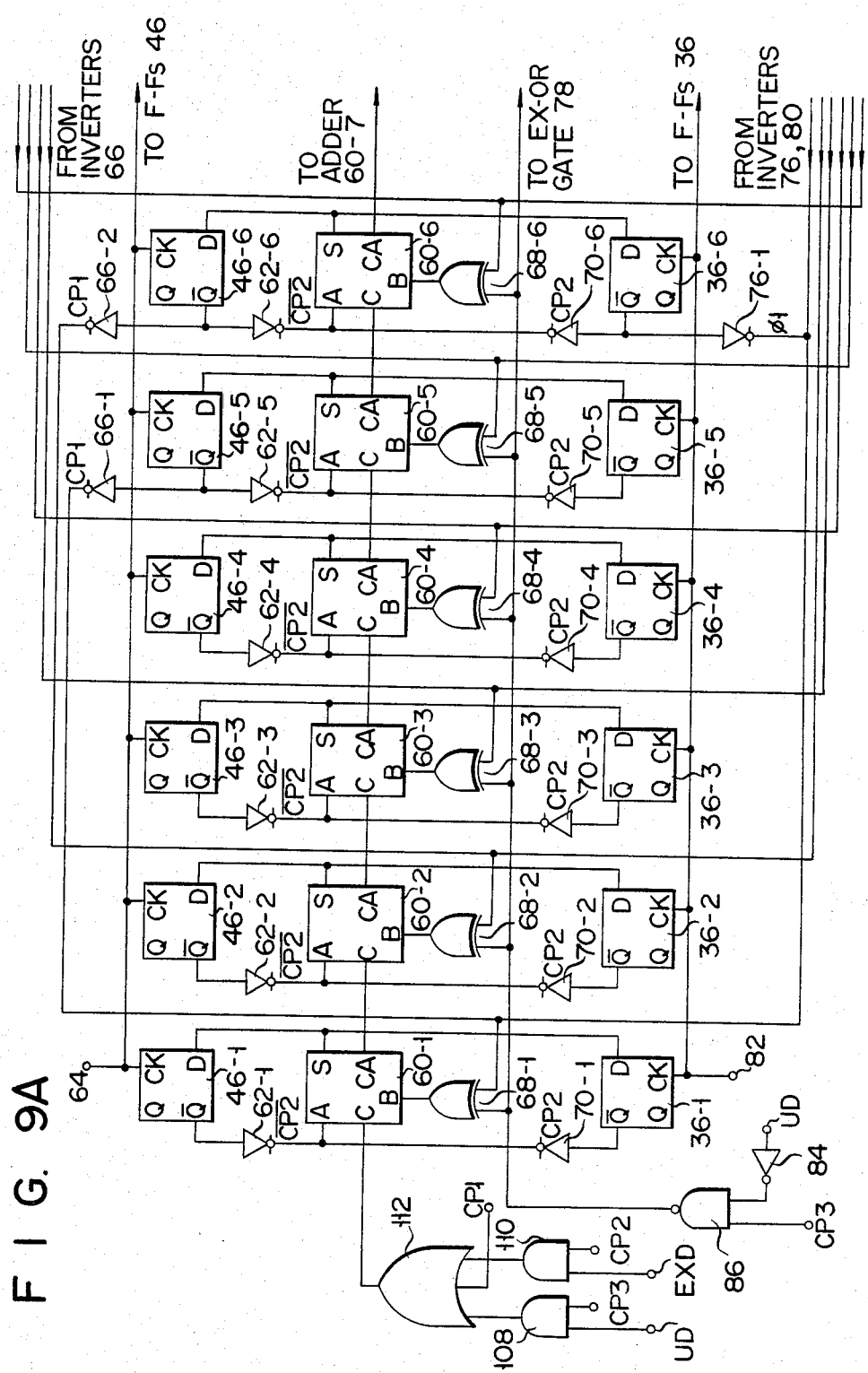
F I G. 9A

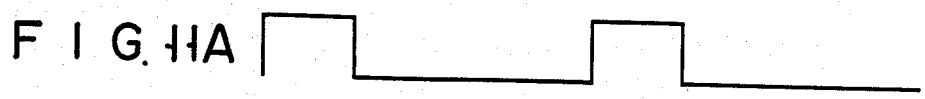
FIG. 11A
FIG. 11B
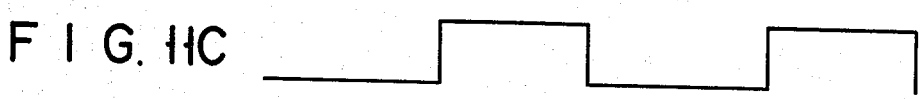
FIG. 11C
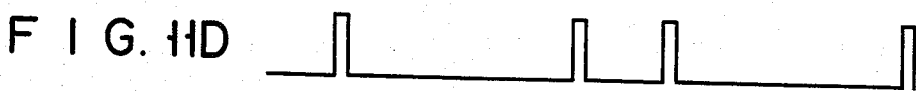
FIG. 11D
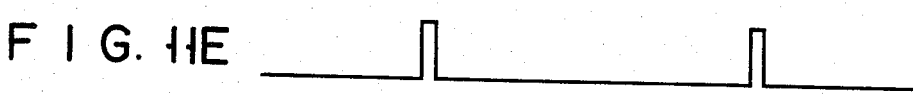
FIG. 11E
FIG. 12
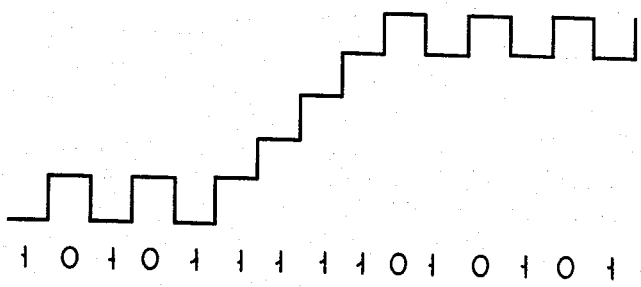
1 0 1 0 1 1 1 1 1 0 1 0 1 0 1

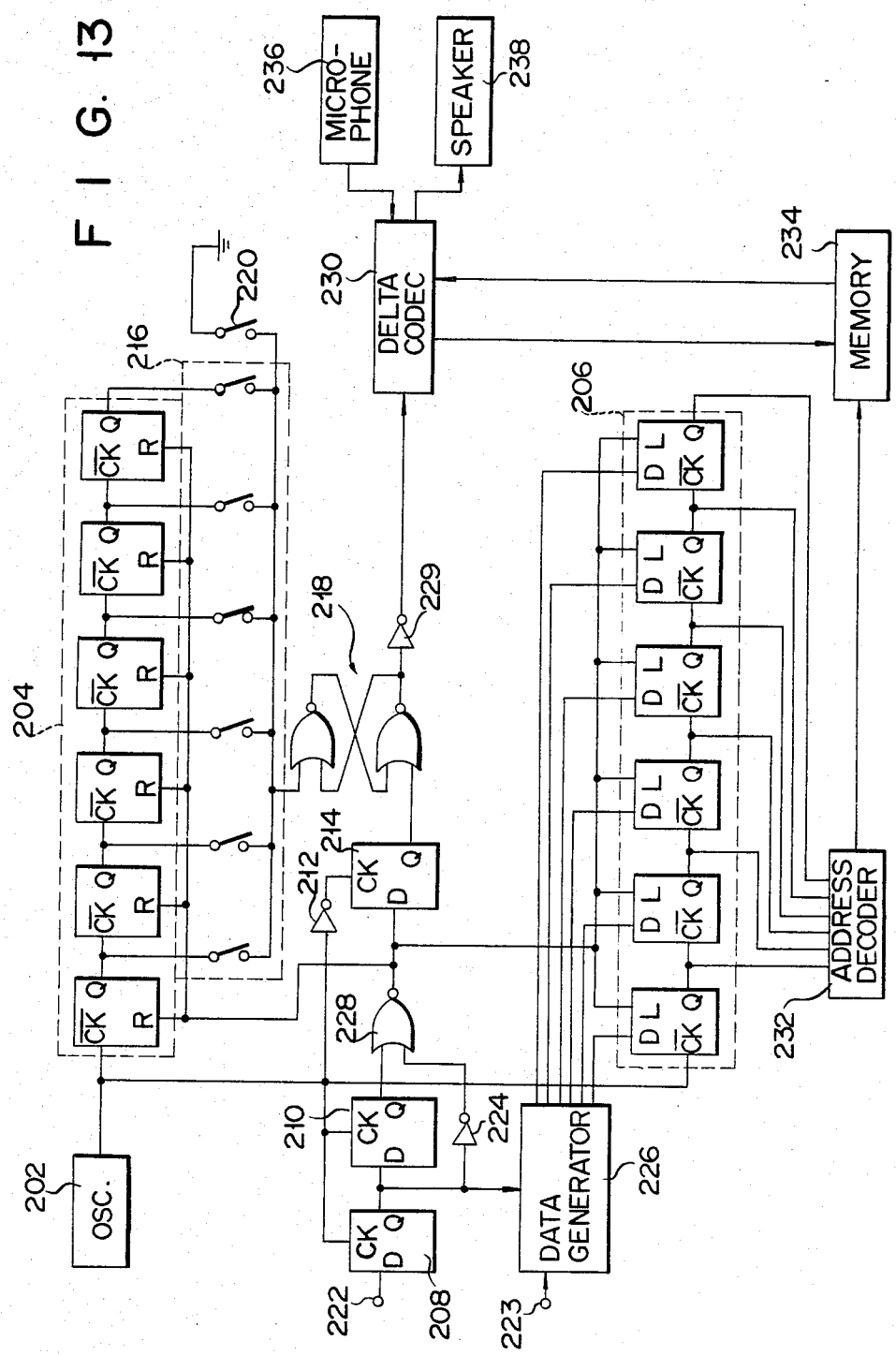

ADAPTIVE DELTA CODEC WHICH VARIES A DELTA SIGNAL IN ACCORDANCE WITH A CHARACTERISTIC OF AN INPUT ANALOG SIGNAL

BACKGROUND OF THE INVENTION

The present invention relates to a circuit for generating a delta value for use in a delta modulation system.

Generally, a delta modulation system has been used for digitally processing analog signals such as voice signals. A modulator (encoder) is comprised of a comparator, a local decoder and sample/hold circuit. An input analog signal and an estimated signal produced from the local decoder are supplied to the comparator and an output signal from the comparator is sampled and held to provide a coded signal. Since the coded signal is also applied to the local decoder functioning as an integrator, the estimate signal is incremented or decremented by a given minute value (a delta value) in accordance with a level of the coded signal and follows a change of the input signal, while changing stepwisely. In other words, the delta modulation means an encoding of one bit, with simple construction. The demodulator (decoder) is comprised of an integrator, as described above.

As described above, in the digital processing by making use of the delta modulation, the delta value is constant and therefore a pulse signal is produced even if no input voice is supplied. The pulse signal thus produced becomes a noise. This noise is called a granular noise. Also at the time of encoding, when the input analog signal rapidly changes, the estimated signal can not follow the rapid change of the input analog signal, producing an overload noise between the estimate signal and the input signal. These noises, in processing the voice signal, are reproduced giving noisy sound, so that an articulation of the reproduced voice is deteriorated. This problem is serious.

In general, the granular noise is smaller as the delta value is smaller, and the overload noise is smaller as the delta value is larger. To comply with the nature of those noises, an adaptive delta modulation system has recently been proposed, in which the delta value is not fixed but is changed in accordance with a change of the input signal. In order to reduce the overload noise, when the input signal is small, the delta value must be made small, while when the input signal change is large, the delta value must be made large. This is realized in a manner that, in a train of bits of the coded signal (the output signal for the encoding and the input signal for the decoding), when the same codes continuously appear in succession, the delta value is increased by a given value (several percentiles of the delta value), while when different codes appear in succession, it is decreased.

An example of a circuit for generating a delta value used in a conventional adaptive delta modulator is illustrated in FIG. 1. Assume that the delta value is expressed by a binary number of twelve bits, and that the circuit includes a register 10 comprised of twelve D flip-flops and an adder/subtractor 12 comprised of twelve full-adders. Output terminals Q of the flip-flops are connected to first input terminals A of corresponding adders, and connected to an integrator (not shown). Inverted output terminals $\overline{Q}$ of the upper 6 bits of those flip-flops in the register 10 are connected to second input terminals B of the adders of the lower six bits of adder/subtractor 12, respectively. A control terminal EXD at which level is set at logic 1 or 0 in accordance with a changing direction of the delta value is connected to second input terminals B of the adders of the upper six bits in the adder/substractor 12. A carry output terminal CA of the adder of each bit is connected to a carry input terminal C of the adder of the subsequent upper bit. The control terminal EXD is connected to a carry input terminal CA of the adder of the least significant bit. An output terminal S of each adder in the adder/subtractor 12 is connected to an input terminal D of the corresponding flip-flop in the register 10. A clock terminal 14 is connected to clock terminals CK of all the flip-flops in the register 10.

The operation of the conventional circuit will be described. The control terminal EXD is set at logic 0 when the same codes continue in the code bit train, while it is set to logic 1 when the same codes are not continued. A case where the control terminal EXD is set at logic 1 level will first be given. Assume that the delta value stored in the register 10, i.e. logic levels of the Q output data of the flip-flops, are d1, d2, ..., d12 in the order from the least significant bit and that logic levels of the $\overline{Q}$ output data of the upper six bits are $\overline{d7}$, $\overline{d8}$, ..., $\overline{d12}$ in the order from the lower to higher bits. The adder/substractor 12 adds the A input data d1, d2, ..., d4, d5, d6, ..., d12 to the B input data d7, d8, ..., d12, 1, 1, ..., 1. When the present delta value is N(n) (in this case, N(n)=0 to 4095), the next delta value N(n+1) obtained by the arithmetic operation is given as follows:

$$N(n + 1) = (d1, d2, \ldots, d6, d7, d8, \ldots, d12) \quad (1)$$
$$+ (\overline{d7}, \overline{d8}, \ldots, \overline{d12}, 1, 1, \ldots, 1)$$
$$+ 1$$
$$= N(n) + \frac{\overline{N(n)}}{64} + 1$$
$$= N(n) - \frac{N(n)}{64}$$
$$= \frac{63}{64} N(n)$$

Hence, an amount of change of the delta value is expressed as follows:

$$N(n + 1) - N(n) = -\frac{N(n)}{64} \quad (2)$$

A case where the control terminal EXD is set at logic 0 will be described. In this case, the B input data of the adders of the upper six bits are all logic 0. This leads to the following relation.

$$N(n + 1) = (d1, d2, \ldots, d6, d7, d8, \ldots d12) + \quad (3)$$
$$(d7, d8, \ldots, d12, 0, 0, \ldots, 0) =$$
$$N(n) + 63 - \frac{N(n)}{64} = \frac{63}{64} N(n) + 63$$

From the above equation, we have the following amount of change of the delta value.

$$N(n + 1) - N(n) = -\frac{N(n)}{64} + 63 \qquad (4)$$

The amount of change of the delta value in the equation (2) is negative, and this indicates an amount of decrease. The amount of change of the delta value in the equation (4) is positive in the range of N(n) from 0 to 4095, and this indicates amount of increase. The amount of decrease (given by the equation (2)) with respect to the present delta value N(n) and the amount of increase (given by the equation (4)) with respect to the present delta value N(n) are respectively shown by a solid line and a broken line in FIG. 2. As given by the equations (2) and (4), as the delta value N(n) is larger, the amount of increase is smaller but the amount of decrease is large. Conversely, as the delta value is smaller, the amount of decrease is small but the amount of increase is larger. Accordingly, the delta value is prevented from being minimized or maximized.

Thus, in this circuit, the delta value may be increased or decreased in accordance with a signal at the control terminal EXD. As described above, the delta value is not maximized or minimized and a rate of increase of the delta value is equal to a rate of decrease. As a result, the delta value changes from the half of the maximum, 2047.5. The variation center value of the delta value means the delta value where the amount of increase is equal to the amount of decrease.

However, in the circuit, the variation center of the delta value is fixed, so that there is a case that an improper delta value is determined when the input signal has some characteristic. In the adaptive delta modulation system for processing the voice signal, a voice signal as the input signal has a variety of voice qualities since persons giving voices have such. The determination of the improper delta value is a very serious problem.

The adaptive delta modulator needs a delta value generating circuit, so that the construction is complicated and a large number of elements are used. In fabricating the circuit by the integrated circuit technology, this hinders an integration density from being made high.

SUMMARY OF THE INVENTION

Accordingly, an object of the present invention is to provide a circuit for generating a delta value for use in an adaptive delta modulation system, which determines delta values adaptable for characteristics of an input analog signal.

According to the present invention, there is provided a circuit for generating a delta value for use in an adaptive delta codec comprising a register for storing a binary signal, a control terminal for indicating increase or decrease of the delta value, an adder/subtractor which is connected at a first input terminal to the output terminal of the register, at a predetermined upper bits of second input terminals and at an arithmetic operation indicating terminal to the control terminal, and arithmetically operates first and second input signals in accordance with a signal level at the control terminal, and suppies the result of the operation to the register, and a gate circuit for allotting a predetermined upper bits of output signals of the register and a signal at the control terminal to the remaining lower bit components of the second input terminals of the adder/subtractor in accordance with the signal level at the control terminal.

BRIEF DESCRIPTION OF THE DRAWINGS

FIG. 3 is a circuit diagram of a delta codec using an embodiment of a delta value generating circuit according to the present invention;

FIG. 5 is a graphical representation of an operation characteristic of the embodiment;

FIG. 7 illustrates a graph representing the operation of the second embodiment;

FIGS. 9A, 9B, and 10 are circuit diagrams of the third embodiment of a delta value generating circuit according to the present invention;

FIGS. 11A to 11E are timing charts useful in explaining the operation of the third embodiment;

FIG. 12 illustrates a relationship between a bit train of a coded signal and an estimate signal auxiliarily used in explaining the operation of the third embodiment; and FIG. 13 is a circuit diagram of a voice record/reproduction system as an application of a delta codec using a delta value generating circuit according to the present invention.

DETAILED DESCRIPTION OF THE PREFERRED EMBODIMENTS

Figure 1:
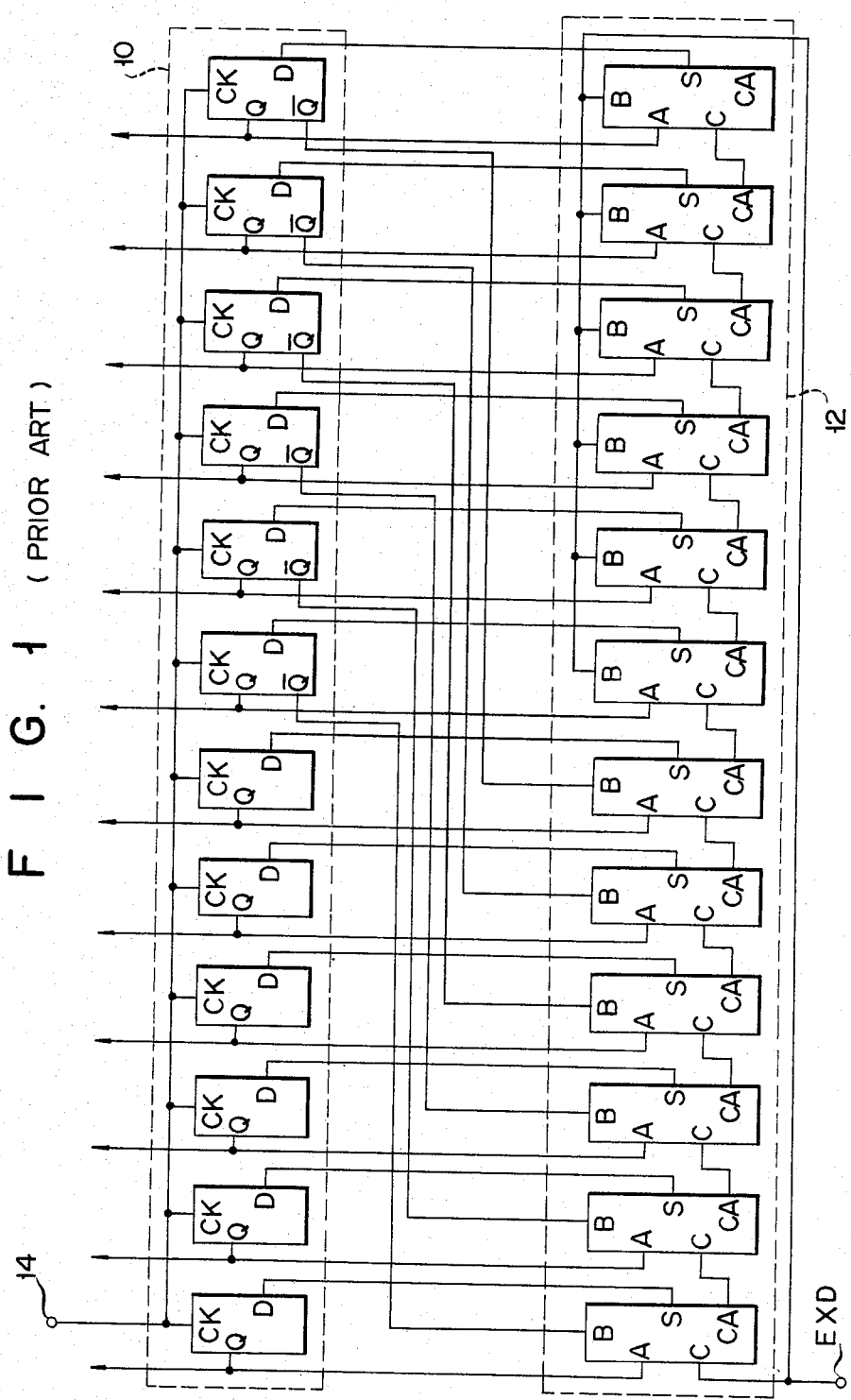
FIG. 1 is a circuit diagram of an example of a conventional delta value generating circuit.

An embodiment of a delta value generating circuit according to the present invention will be described referring to the accompanying drawings. FIG. 3 is a circuit diagram of a delta codec incorporating an embodiment of a delta value generating circuit according to the present invention. An input terminal $A_{in}$ to which an analog signal such as a voice signal is supplied is connected to a non-inverting input terminal of a comparator 22, and its output terminal is connected to a first input terminal of an AND gate 26 through a sample and hold circuit 24 (referred to as an S/H circuit). A mode switch terminal $\overline{M}/D$ for switching between a modulation and demodulation is connected to a second input terminal of the AND gate 26 through an inverter 28, and is directly connected to a first input terminal of an AND gate 30. The mode switch terminal $\overline{M}/D$ is at logic 0 in a modulation mode but at logic 1 in a demodulation mode. A digital signal input terminal $D_{in}$ is connected to a second input terminal of the AND gate 30. Output terminals of the AND gates 26 and 30 are connected to respective input terminals of an OR gate 32. The output terminal of the AND gate 26 is also connected to a digital signal output terminal $D_{out}$. An output terminal of the OR gate 32 is connected to a control circuit 34.

A delta value generating circuit 40 is comprised of a register 36 and an adder/subtractor 38, as will be described in detail. The adder/subtractor 38 performs an addition or a subtraction operation in accordance with a control signal from the control circuit 34 by using data in the register 36, and the result of the arithmetic operation is stored into the register 36. The initial data of the register 36 is set by the control circuit 34.

The data stored in the register 36 is also supplied to an adder/subtractor 44 in an integrating circuit 42. The integrating circuit 42 also includes a register 46. The adder/subtractor 44 performs an addition or a subtraction operation of the data stored in the registers 36 and 42 in accordance with a control signal from the control circuit 34, and the result of the arithmetic operation is stored in the register 46. The initial data of the register 46 is also set by the control circuit 34.

The output data from the integrating circuit, i.e. the output data from the register 46, is supplied to a D/A converter 48 of which output terminal is connected to an inverting input terminal of the comparator 22 and also to an analog signal output terminal $A_{out}$.

Figure 4:
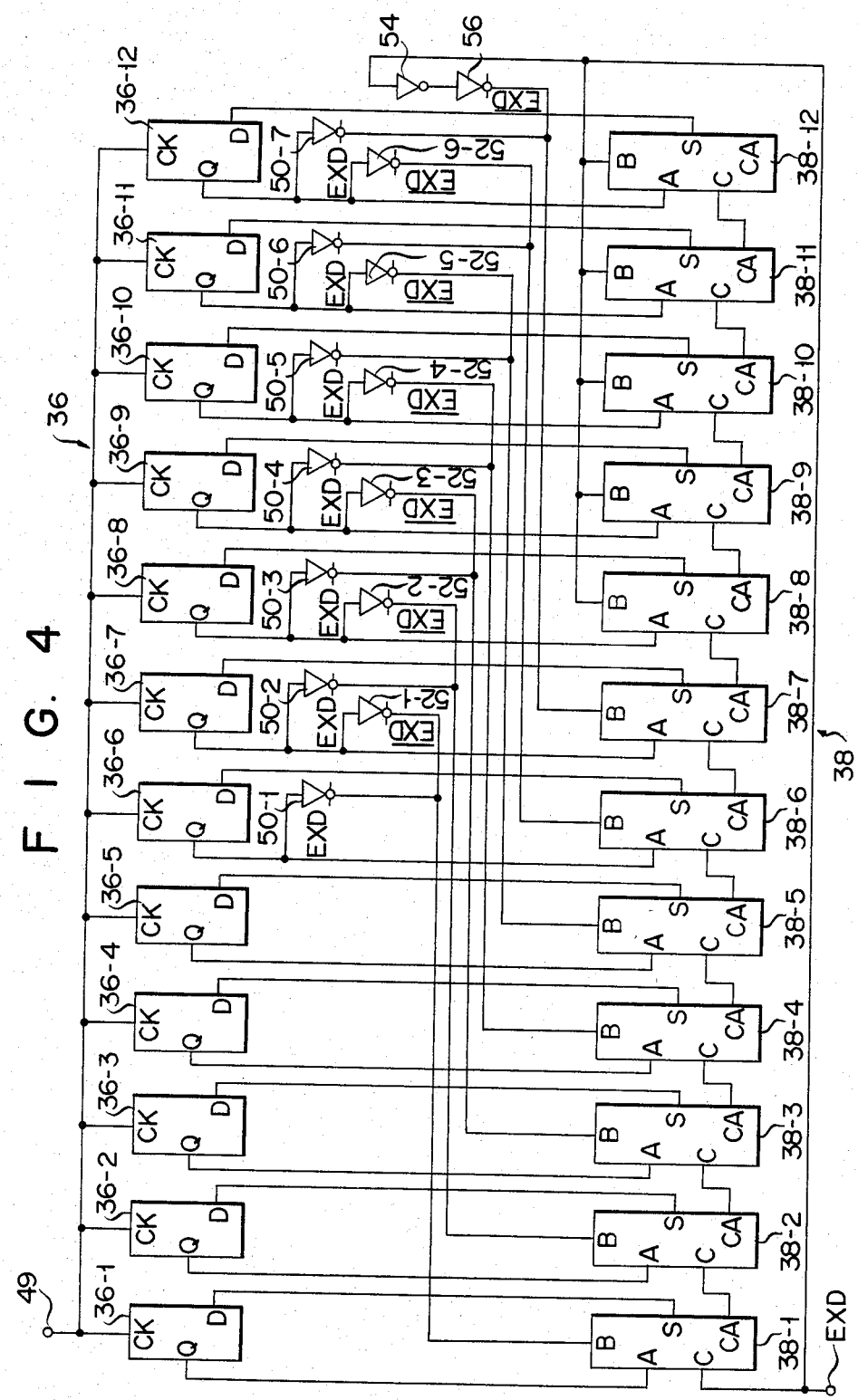
FIG. 4 is a circuit diagram of the embodiment of the delta value generating circuit.

The delta value generating circuit 40 will be described in detail referring to FIG. 4. Assume that the delta value is represented by a binary signal of 12 bits. The register 36 has twelve D flip-flops 36-1, 36-2, ..., 36-12, in which the D flip-flop 36-1 corresponds to the least significant bit and the D flip-flop 36-12 corresponds to the most significant bit. A clock terminal 49 is connected to clock terminals CK of all the D flip-flops 36-1 through 36-12. The adder/subtractor 38 is also comprised of 12 full-adders 38-1, 38-2, ..., 38-12, in which the full-adder 38-1 corresponds to the least significant bit and the full-adder 38-12 to the most significant bit. Output terminals Q of the D flip-flops 36-1 to 36-12 are connected to first input terminals A of the full-adders 38-1 to 38-12, respectively. The output terminals Q of the D flip-flops 36-6 to 36-12 of the upper seven bits in the register 36 are respectively connected through clocked inverters 50-1, 50-2, ..., 50-7 to second input terminals B of the full-adders 38-1 to 38-7 of the lower seven bits. Clock terminals of the clocked inverters 50-1 to 50-7 are connected to a control terminal EXD. The output terminals Q of the flip-flops 36-7 to 36-12 of the upper six bits are respectively connected to the second input terminals B of the full-adders 38-1 through 38-6 of the lower six bits, through clocked inverters 52-1, 52-2, ..., 52-6. Clock terminals of the clocked inverters 52-1 to 52-6 are connected to a control terminal $\overline{\text{EXD}}$ to which the inverted signal of the signal appearing at the control terminal EXD. The control terminal EXD is connected to a second input terminal B of the full-adder 38-7 of the seventh bit, through an inverter 54 and a clocked inverter 56 in series, and is directly connected to second input terminals B of the full-adders 38-8 to 38-12 of the upper five bits. Carry output terminals CA of the full-adders 38-1 to 38-11 are respectively connected to carry input terminals C of the full-adders 38-2 to 38-12 of the subsequent upper bit. The control terminal EXD is connected to a carry input terminal C of the full-adder 38-1 of the least significant bit. Output terminals S of the full-adders 38-1 to 38-12 are respectively connected to input terminals D of the D flip-flops 36-1 to 36-12. Although not shown, the control terminals EXD and $\overline{\text{EXD}}$, and the clock terminal 49 are connected to the control circuit 34. The initial data from the control circuit 34 is supplied to the input terminals D of the flip-flops 36-1 to 36-12 and the output terminals Q of the D flip-flop 36-1 to 36-12 are connected to the adder/subtractor 44 in the integrating circuit 42.

The operation of the embodiment of the delta value generating circuit will be described with relation to the operation of the overall delta codec shown in FIG. 3.

The operation of the codec in a modulation mode will be described. In a modulation mode, the switch terminal $\overline{\text{M/D}}$ is at logic 0, so that the AND gate 26 is conductive while the AND gate 30 is nonconductive. An analog signal is supplied to the noninverting input terminal of the comparator 22 through an input terminal $A_{in}$, and the comparator 22 produces a signal of logic 1 or 0 according to whether or not the analog input signal has a higher level than the output analog signal from the D/A converter 48. The output signal from the comparator 22 is sampled and held in the S/H circuit 24 and the S/H circuit 24 produces a coded signal of one bit. The coded signal is supplied to the digital signal output terminal $D_{out}$ through the AND gate 26 and to the control circuit 34 through the AND gate 26 and the OR gate 32. The control circuit 34 directs the kind of the arithmetic operation by the adder/subtractor 38 and 44 in accordance with the coded signal. More specifically, when two same codes continuously appear in the coded signal, the control terminal EXD is set at logic 0. When the same codes are not continued, the control terminal EXD is set at logic 1. When the code is logic 0, a subtraction command is supplied to the adder/subtractor 44. When the code is logic 1, an addition command is applied to the same.

When the control terminal EXD is at logic 1, the clocked inverters 50-1 to 50-7 operate. The Q output signals of the bits of the register 36 are respectively supplied to the first input terminals A of the bits of the adder/subtractor 38. The Q output signals of the upper 7 bits of the resiter 36 are supplied through the clocked inverters 50-1 to 50-7 to the second input terminals B of the lower 7 bits of the adder/subtractor 38, respectively. Accordingly, when the logic levels of the Q output data of the D flip-flops 36-1 to 36-12 are d1 to d12, respectively, the adder/subtractor 38 executes the following arithmetic operation. The result of the operation is stored in the register 36. Assuming that the data of the register 36, i.e. the delta value, is N(n), the following new delta value N(n+1) is obtained.

$$N(n + 1) = (d1, d2, \ldots, d7, d8, d9, \ldots, d12) \quad (5)$$
$$+ (d6, d7, \ldots, d12, 1, 1, \ldots, 1)$$
$$+ 1$$
$$= N(n) + \frac{\overline{N(n)}}{32} + 1$$
$$= N(n) - \frac{N(n)}{32}$$

An amount of change of the delta value is expressed by:

$$N(n + 1) - N(n) = -\frac{N(n)}{32} \quad (6)$$

When the control terminal EXD is set at logic 0, the clocked inverters 52-1 to 52-6, and 56 operate. The result of the operation N(n+1) is represented by:

$$N(n + 1) = (d1, d2, \ldots, d6, d7, d8, \ldots, d12) + \quad (7)$$
$$(d7, d8, \ldots, d12, 0, 0, \ldots, 0) =$$
$$N(n) + 63 - \frac{N(n)}{64} = \frac{63}{64} N(n) + 63$$

Therefore, an amount of change of the delta value is given by:

$$N(n + 1) - N(n) = -\frac{N(n)}{64} + 63 \qquad (8)$$

As seen from the equation (6), when the control terminal EXD is at logic 1, the delta value decreases. The equation (8) indicates that when the control terminal EXD is at logic 0, if N(n) is 0 to 4095, the delta value increases. When two same codes are arranged continuously, the delta value is increased, and the overload noise is reduced. When those are not the same, the delta value decreases to reduce the granular noise. In this way, the adaptive delta modulation is realized. The integrating circuit 42 responds to a command representing a kind of the operation issued from the control circuit 34 to add the delta value to the data in the register 46 or substract the delta data from the data in the register 46. Therefore, the output signal from the integrating circuit 42 increases or decreases in accordance with the coded signal. The output signal from the D/A converter 48 for D/A converting the output signal from the integrating circuit 42 is an estimate signal of the input analog signal.

An amount of decrease (given by the equation (6)) and an amount of increase (given by the equation (8)) with respect to the present delta value N(n) are respectively indicated by a solid line and a broken line in FIG. 5. As seen from FIG. 5, a rate of increase of the delta value is not equal to a rate of decrease of the same. The rate of increase is equal to that of the conventional one, but the rate of decrease is double that of the conventional one. Therefore, in the present embodiment, the center of variation of the delta value is not the half of the maximum value of the delta value, but is lower than it, 1365.5.

The operation of the circuit in a demodulation mode follows. In this case, the switch terminal $\overline{M}/D$ is at logic 1, so that the AND gate 26 is nonconductive but the AND gate 30 is conductive. For this reason, a train of coded bits each of 1 bit supplied to the digital input terminal $D_{in}$ is supplied to the control circuit 34 through the AND gate 30 and OR gate 32. The control circuit 34 determines the level of the control terminal EXD as in a modulation mode. As in a modulation mode, an estimate signal (digital) is produced from the integrating circuit 46 and the estimate signal is converted into an analog signal by the A/D converter 48. Thus, the output signal from the A/D converter 48 is produced as a demodulated signal from the analog output terminal $A_{out}$.

Figure 6:
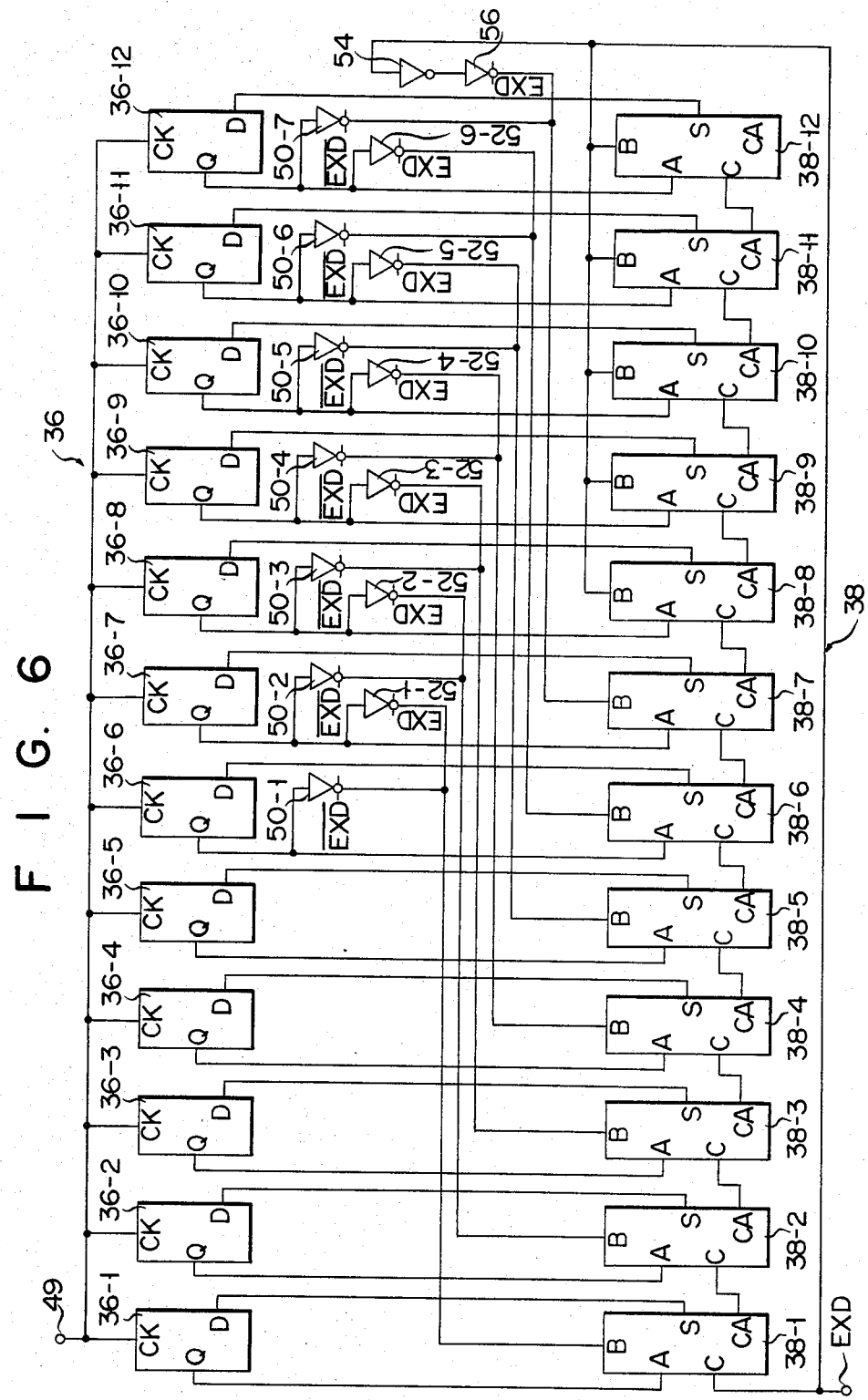
FIG. 6 is a circuit diagram of a second embodiment of a delta value generating circuit according to the present invention.

Another embodiment of the digital value generating circuit according to the present invention will be described. Same numerals are used for designating like portions in the first embodiment, for simplicity. FIG. 6 is a circuit diagram of the second embodiment. A difference of the second embodiment from the first embodiment resides in that the connection of the clock terminals of the clocked inverters 50, 52 and 56. In the second embodiment, the clock terminals of the clocked inverters 50-1 to 50-7 are connected to the control terminal $\overline{EXD}$ and the clock terminals of the clocked inverters 52-1 to 52-6 and 56 are connected to the control terminal EXD.

The operation of the second embodiment follows. When the control terminal EXD is at logic 1, the clocked inverters 52-1 to 52-6 and 56 operate. Accordingly, the result of the operation is given by:

$$N(n + 1) = (d1, d2, \ldots, d6, d7, d8, \ldots, d12) \qquad (9)$$

$$+ (\overline{d7}, \overline{d8}, \ldots, \overline{d12}, 1, 1, \ldots, 1)$$

$$+ 1$$

$$= N(n) + \overline{\frac{N(n)}{64}} + 1$$

$$= N(n) - \frac{N(n)}{64}$$

From the above equation, an amount of change of the delta value is expressed by:

$$N(n + 1) - N(n) = -\frac{N(n)}{64} \qquad (10)$$

When the control terminal EXD is at logic 0, the clocked inverters 50-1 to 50-7 operate, so that the result of the operation N(n+1) is given by:

$$N(n + 1) = (d1, d2, \ldots, d7, d8, d9, \ldots, d12) \qquad (11)$$

$$+ (\overline{d6}, \overline{d7}, \ldots, \overline{d12}, 0, 0, \ldots, 0)$$

$$= N(n) + 127 - \frac{N(n)}{32}$$

$$= \frac{31}{32} N(n) + 127$$

Therefore, an amount of change of the delta value is expressed by:

$$N(n + 1) - N(n) = -\frac{N(n)}{32} + 127 \qquad (12)$$

Also in the second embodiment, when the control terminal EXD is at logic 1, the delta value decreases, as seen from the equation (10). When the control terminal EXD is at logic 0, the delta value increases, as seen from the equation (12). The amount of decrease the delta value (given by the equation (10)) and the amount of increase (given by the equation (12)) with respect to the present delta value are respectively indicated by a solid line and a broken line in FIG. 7. As seen from FIG. 7, in the second embodiment, the rate of increase of the delta value is double the rate of decrease. Therefore, according to the second embodiment, the center of variation of the delta value is made high at 2709.5, contrary to the first embodiment.

Figure 8:
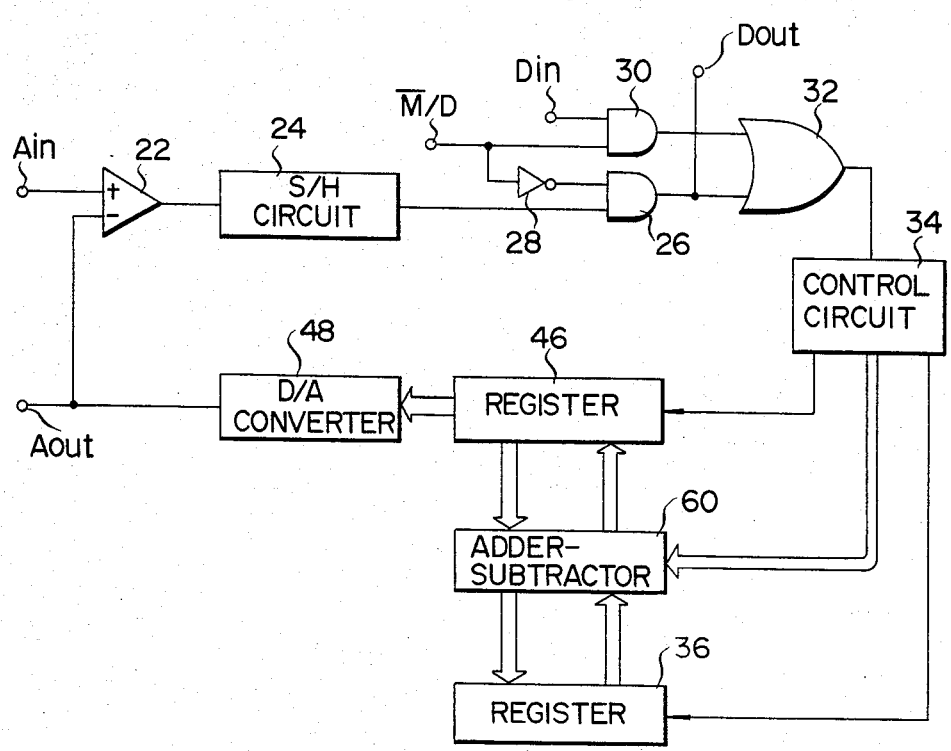
FIG. 8 is a circuit diagram of a delta codec using a third embodiment of a delta value generating circuit according to the present invention.

A third embodiment of a delta value generating circuit will be described. The third embodiment employs the adder/subtractor used in the integrating circuit. FIG. 8 is a circuit diagram of a delta codec using the third embodiment. In the present embodiment, the register 36 for generating the delta value and the register 46 for the integration are both connected to an adder/subtractor 60. Various control signals are supplied from the control circuit 34 to the adder/subtractor 60, as will be described later.

Figure 9B:
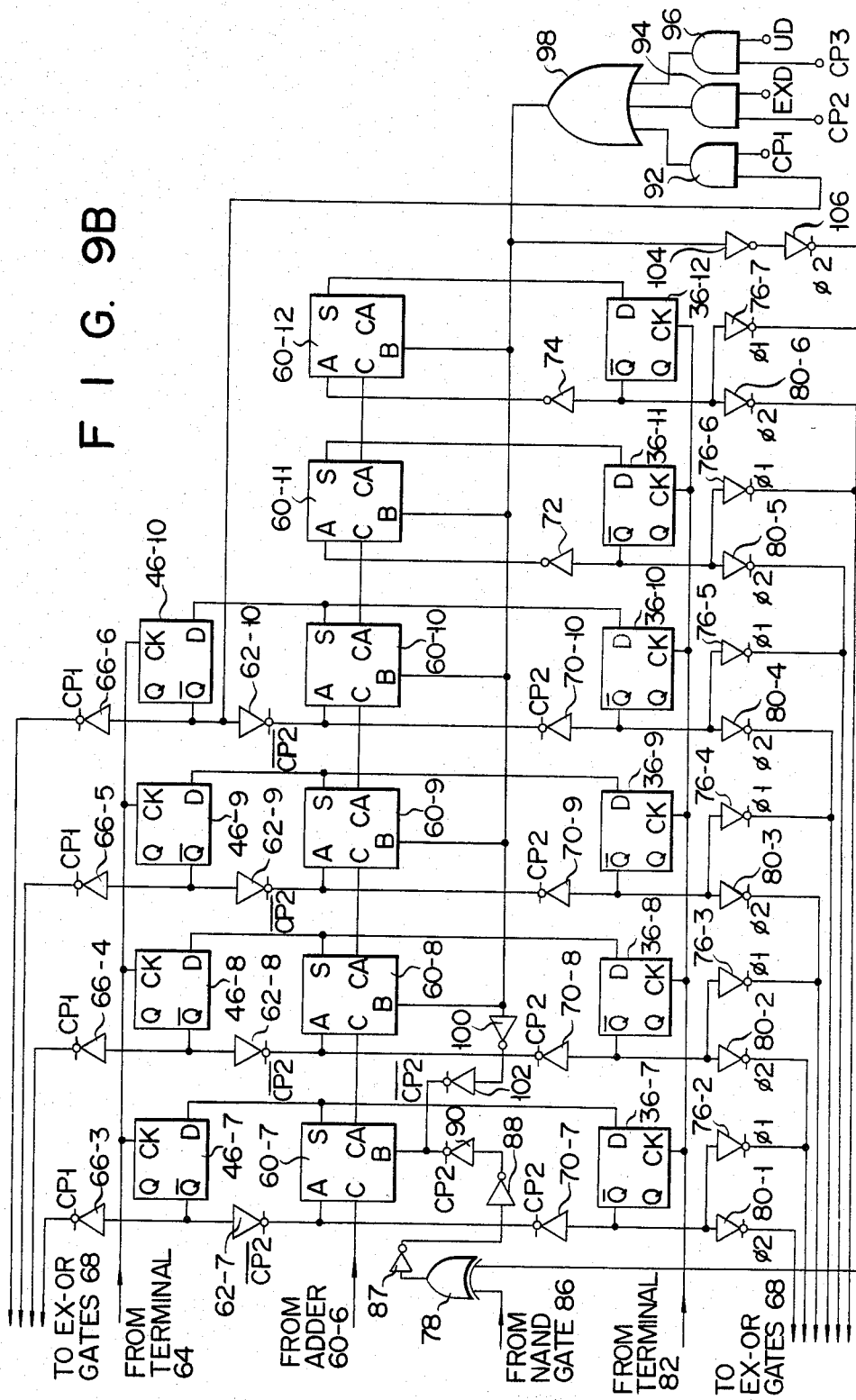

FIGS. 9A and 9B coperate to form a circuit diagram of the registers 36 and 46 and adder/subtractor 60. In the present embodiment, the delta value is expressed by twelve bits, while the estimated value by ten bits. The adder/subtractor 60 is comprised of 12 full-adders 60-1, 60-2, ..., 60-12. The register 46 for the integration is comprised of 10 D flip-flops 46-1, 46-2, ..., 46-10. The register 36 for the delta value generation is comprised of 12 D flip-flops 36-1, 36-2, ..., 36-12. Inverted output terminals $\overline{Q}$ of the D flip-flops 46-1 to 46-10 are respectively connected to first input terminals A of the full-adders 60-1 to 60-10 of the lower ten bits of the adder/subtractor 60, through clocked inverters 62-1 to 62-10. Clock terminals of the clocked inverters 62-1 to 62-10 are connected to a clock terminal CP2. A clock terminal 64 is connected to clock terminals of the D flip-flops 46-1 to 46-10. The inverted output terminals $\overline{Q}$ of the D flip-flops 46-5 to 46-10 of the upper six bits of the integration register 46 are respectively connected to first input terminals of EX-OR gates 68-1 to 68-6, through clocked inverters 66-1 to 66-6. Clock terminals of the clocked inverters 66-1 to 66-6 are connected to a clock terminal CP1.

Inverted output terminals $\overline{Q}$ of the D flip-flops 36-1 to 36-10 of the lower ten bits of the register for the delta value generation are respectively connected to the first input terminals A of the full-adders 60-1 to 60-10 of the lower ten bits in the adder/subtractor 60, through clocked inverters 70-1 to 70-10. Clock terminals of the clocked inverters 70-1 to 70-10 are connected to a clock terminal CP2. Inverted output terminals $\overline{Q}$ of the D flip-flops 36-11 and 36-12 of the upper two bits are respectively connected to first input terminals A of the full-adders 60-11 and 60-12 through inverters 72 and 74. The inverted output terminals $\overline{Q}$ of the D flip-flops 36-6 to 36-12 of the upper seven bits are respectively connected through clocked inverters 76-1 to 76-7 to the first input terminals of the EX-OR gates 68-1 to 68-6 and a first input terminal of an EX-OR gate 78. Clock terminals of the clocked inverters 76-1 to 76-7 are connected to a clock terminal $\phi 1$. The inverted output terminals $\overline{Q}$ of the D flip-flops 36-7 to 36-12 of the upper six bits are connected to the first input terminals of the EX-OR gates 68-1 to 68-6, through clocked inverters 80-1 to 80-6 of which clock terminals are connected to a clock terminal $\phi 2$. A clock terminal 82 is connected to clock terminals CK of the D flip-flops 36-1 to 36-12.

A control terminal UD which is set at a level according to an operational direction of the integration, i.e. an increasing direction or a decreasing direction, is connected to a first input terminal of an NAND gate 86 through an inverter 84. A clock terminal CP3 is connected to a second input terminal of the NAND gate 86 of which an output terminal is connected to second input terminals of the EX-OR gates 68-1 to 68-6 and 78. Output terminals of the EX-OR gates 68-1 to 68-6 are respectively connected to second input terminals B of the full-adders 60-1 to 60-6 of the lower six bits of the adder/subtractor 60. An output terminal of the EX-OR gate 78 is connected to a second input terminal B of the full-adder 60-7 of the seventh bit through inverters 87 and 88 and a clocked inverter 90 in series. A clock terminal of the clocked inverter 90 is connected to the clock terminal CP2.

The inverted output terminal $\overline{Q}$ of the D flip-flop 46-10 of the most significant bit of the integration register 46 and the clock terminal CP1 are connected to input terminals of an AND gate 92. A control terminal EXD which is set at a level in accordance with a kind of the arithmetic operation when the delta value is generated, i.e. the addition or the subtraction, and the clock terminal CP2 are connected to input terminals of an AND gate 94. The control terminal UD and the clock terminal CP3 are connected to input terminals of an AND gate 96. The output terminals of the AND gates 92, 94 and 96 are connected to input terminals of an OR gate 98 of which an output terminal is connected to a second input terminal B of the full-adder 60-7 of the seventh bit through an inverter 100 and a clocked inverter 102 in series. A clock terminal of the clocked inverter 102 is connected to the clock terminal $\overline{CP2}$. The output terminal of the OR gate 98 is connected to a second input terminals B of the full-adders 60-8 to 60-12. The output terminal of the OR gate 98 is also connected to the second input terminal of the EX-OR gate 78 through an inverter 104 and a clocked inverter 106. A clock terminal of the clocked inverter 106 is connected to the clock terminal $\phi 2$.

The control terminal UD and clock terminal CP3 are connected to input terminals of an AND gate 108. The control terminal EXD and clock terminal CP2 are connected to input terminals of an AND gate 110. The clock terminal CP1 and output terminals of the AND gates 108 and 110 are connected to input terminals of an OR gate 112 of which an output terminal is connected to a carry input terminal C of the full-adder 60-1 of the least significant bit. Carry output terminals CA of the full-adders 60-1 to 60-11 are connected to carry input terminals C of the full-adders 60-2 to 60-12 of the next higher bits, respectively. Output terminals S of the full-adders 60-1 to 60-10 of the lower ten bits are connected to input terminals D of the D flip-flops 46-1 to 46-10, respectively. The output terminals S of the full-adders 60-1 to 60-12 are connected to input terminals D of the D flip-flops 36-1 to 36-12, respectively.

Figure 10:
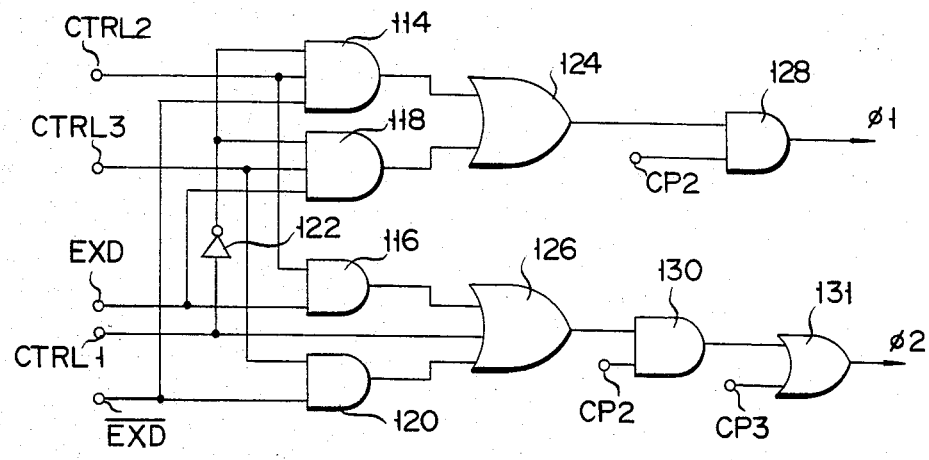

Clock signals at the clock terminals $\phi 1$ and $\phi 2$ are generated from a circuit shown in FIG. 10. As described later, control terminals CTRL1 to CTRL3 which are set at the level depending on the nature of the analog signal to be modulated are provided. The control terminal CTRL2 is connected to first input terminals of AND gates 114 and 116. The control terminal CTRL3 is connected to first input terminals of AND gates 118 and 120. The control terminal EXD is connected to second input terminals of the AND gates 116 and 118, and the control terminal $\overline{EXD}$ is connected to second input terminals of the AND gates 114 and 120. The control terminal CTRL1 is connected to third input terminals of the AND gates 114 and 118 through an inverter 122. Output terminals of the AND gates 114 and 118 are connected to input terminals of an OR gate 124. An output terminal of the OR gate 124 and the clock terminal CP2 are connected to input terminals of an AND gate 128 of which an output terminal is connected to the clock terminal $\phi 1$. Output terminals of the AND gates 116 and 120 and the control terminal CTRL1 are connected to input terminals of an OR gate 126. An output terminal of the OR gate 126 and the clock terminal CP2 are connected to input terminals of an AND gate 130. An output terminal of the AND gate 130 and the clock terminal CP3 are connected to input terminals of an OR gate 131 of which an output terminal is connected to the clock terminal $\phi 2$. Althrough not shown, the control terminals UD, EXD, CTRL1 to CTRL3, and the clock terminals CP1 to CP3 are connected to the control circuit 34. The output terminal of the integration register 46 is connected to the D/A converter 48.

The operation of the adaptive delta codec using the third embodiment will be described. A level at one of the control terminals CTRL1 to CTRL3 is set at logic 1 depending on the nature of an analog signal, for example, tone, etc. for a voice signal, while levels of the remaining two control terminals are set at logic 0. The codec operation is periodic and each period is divided into subperiods T1, T2 and T3. The clock terminals CP1 to CP3 are at logic 1 only during the respective periods T1 to T3, while at logic 0 during the other periods, as shown in FIGS. 11A to 11C.

A case where the control terminal CTRL1 is at logic 1 will first be described. The clock terminal $\phi1$ is always at logic 0, while the clock terminal $\phi2$ is at logic 1 during the periods T2 and T3. During the period T1, the clock terminals CP1 and $\overline{CP2}$ are at logic 1. Therefore, the clocked inverters 62-1 to 62-10, 66-1 to 66-6, and 102 operate. Accordingly, the $\overline{Q}$ output signals of bits of the integration register 46 are inverted and the inverted ones are respectively supplied as Q output signals to the first input terminals A of the full-adders 60-1 to 60-10 of the lower 10 bits of the adder/subtractor 60. The $\overline{Q}$ output signals of the D flip-flops 46-5 to 46-10 of the upper six bits are inverted and are supplied as Q output signals to the first input terminals of the EX-OR gates 68-1 to 68-6, respectively. At this time, the clock terminal CP3 is at logic 0 level and hence the output terminal of the NAND gate 86, i.e. the second input terminals of the EX-OR gates 68-1 to 68-6, is at logic 1. Therefore, the EX-OR gates 68-1 to 68-6 serve as inverters and the $\overline{Q}$ output signals from the D flip-flops 46-5 to 46-10 are respectively connected to the second input terminals B of the full-adders 60-1 to 60-6 of the lower six bits. The $\overline{Q}$ output signal of the D flip-flop 46-10 of the most significant bit of the integration register 46 is supplied to the second input terminals B of the full-adders 60-8 to 60-12 of the upper five bits, through the AND gate 92 and the OR gate 98. The $\overline{Q}$ output signal from the D flip-flop 46-10 is connected to the second input terminal B of the full-adder 60-7 of the seventh bit, through the inverters 100 and 102. A logic 1 signal from the clock terminal CP1 is supplied to the carry input terminal C of the full-adder 60-1 of the least significant bit, through the OR gate 112. Assuming that the logic levels, of the Q output data from the D flip-flops 46-1 to 46-10 of the integration register 46 are D1 to D10, respectively, the adder/subtractor 60 performs the following arithmetic operation during the period T1. If it is assumed that the present data of the integration register 46, i.e. an estimate value (absolute value) is E(n), the estimated value (absolute value) E(n+1) obtained by the operation is given by:

$$E(n + 1) = (D1, D2, \ldots, D6, D7, D8, \ldots, D12) \qquad (13)$$

$$+ (\overline{D5}, \overline{D6}, \ldots, \overline{D10}, \overline{D10}, \overline{D10}, \ldots, \overline{D10})$$

$$+ 1$$

$$= E(n) + \frac{\overline{E(n)}}{16} + 1$$

$$= E(n) - \frac{E(n)}{16}$$

$$= \frac{15}{16} E(n)$$

From the equation (13), the estimated value E(n) in the register 46 is multiplied by 15/16 during the period T1. Approximately at the termination of the period T1, the clock pulse as shown in FIG. 11D is supplied to the clock terminal 64, the output signal from the adder/subtractor 60 is stored in the register 46. That is, during the period T1, an estimate value of the input analog signal is multiplied by 15/16 and the absolute value is slightly decreased. This implies the following. For example, when a train of coded bits have logic 1 and 0 alternately arranged, the estimated signal is repetitively increased and decreased by the delta value. However, it does not always change from a point near the zero of values (+511 to −512) represented by the register 46, i.e. a point of the half amplitude of the analog signal obtained by D/A converting the output signal from the register 46. For example, when the code repeats logic 1 and logic 0, as shown in FIG. 12, if only the codes of logic 1 continuously appear due to noise, interference or the like, the estimated signal does not change from the zero, even if the codes periodically repeats logic 1 and 0 after that. FIG. 12 illustrates a train of coded bits and the corresponding stepwise estimated signal.

Note here that since the estimated signal, during the period T1, is decreased compared to the previous estimated signal, it is prevented that the amplitude of the modulation analog signal abnormally increases or decreases.

During the period T2, the clock terminal CP2 is at logic 1, so that the clocked inverters 70-1 to 70-10 and 90 are in an operation mode. Since the clock terminal $\phi2$ is at logic 1, the clocked inverters 80-1 to 80-6, 106 are in an operation mode. Therefore, the $\overline{Q}$ inverted output signals of bits of the register 36 for generating the delta value are supplied as Q output signals to the first input terminals A of the full-adders 60-1 to 60-12, through the clocked inverters 70-1 to 70-10 and the inverters 72 and 74, respectively. The inverted output signals of the D flip-flops 36-7 to 36-12 of the upper six bits are respectively supplied to the first input terminals of the EX-OR gates 68-1 to 68-6, through the clocked inverters 80-1 to 80-6. Also at this time, the output terminal of the NAND gate 86 is at logic 1, and hence the EX-OR gates 68-1 to 68-6 and 78 serve as inverters. Therefore, the $\overline{Q}$ output signals from the D flip-flops 36-7 to 36-12 of the upper six bits are supplied to the second input terminals B of the full-adders 60-1 to 60-6 of the lower six bits. During the period T2, the AND gate 94 is conductive and therefore the control terminal EXD is coupled with the second input terminals B of the full-adders 60-8 to 60-12 of the upper five bits through the AND gate 94 and OR gate 98. The control terminal EXD is coupled to the second input terminal B of the full-adder 60-7 of the seventh bit through the AND gate 94, OR gate 98, inverter 100 and clocked inverter 102 in series. Since the AND gate 110 is conductive by the signal level at the clock terminal CP2, the control terminal EXD is connected to the carry input terminal C of the full-adder 60-1 of the least significant bit. As described above, the control terminal EXD is set at logic 0 for increasing the amount of change of the delta value, while it is set at logic 1 for decreasing the same. Assuming that the logic levels of the Q output data of the D flip-flops 36-1 to 36-12 in the register 36 for the delta value generation are d1 to d12, respectively, the adder/substractor 60 performs the following operation during the period T2. If the present delta value in the register is N(n), the delta value obtained by the result of the operation is N(n+1).

When the control terminal EXD is at logic 1, $$N(n + 1) = (d1, d2, \ldots, d6, d7, d8, \ldots, d12) \quad (14)$$

$$+ (\overline{d7}, \overline{d8}, \ldots, \overline{d12}, 1, 1, \ldots, 1)$$

$$+ 1$$

$$= N(n) + \frac{\overline{N(n)}}{64} + 1$$

$$= N(n) - \frac{N(n)}{64}$$

$$= \frac{63}{64} N(n)$$

When the control terminal EXD is at logic 0, $$N(n + 1) = (d1, d2, \ldots, d6, d7, d8, \ldots, d12) \quad (15)$$

$$+ (\overline{d7}, \overline{d8}, \ldots, \overline{d12}, 0, 0, \ldots, 0)$$

$$= N(n) + 63 - \frac{N(n)}{64}$$

$$= \frac{63}{64} N(n) + 63$$

Figure 2:
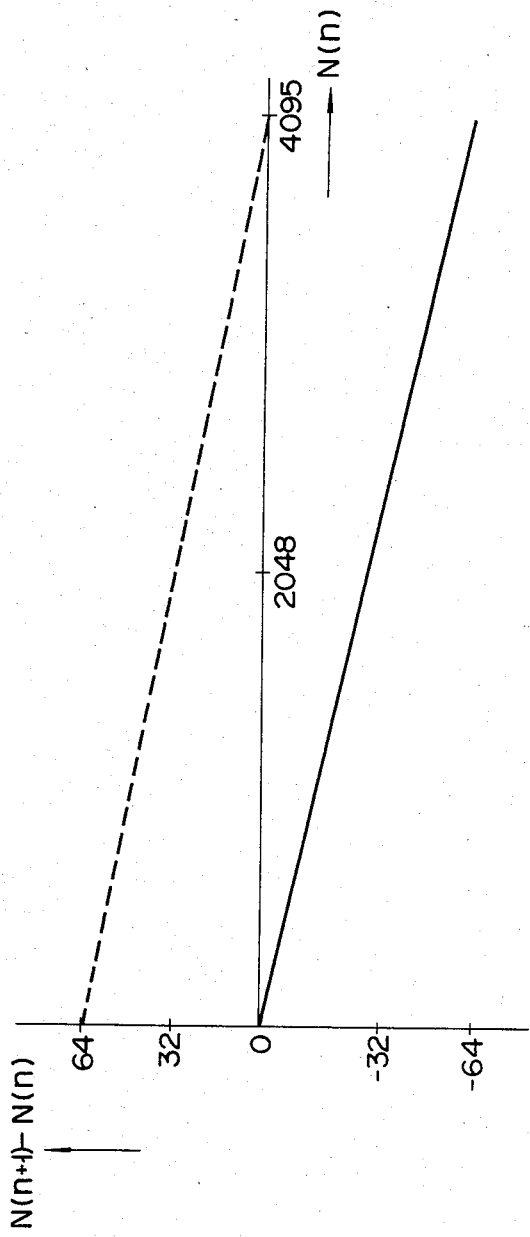
FIG. 2 is a graphical representation of an operation characteristic of the circuit shown in FIG. 1.

The equations (14) and (15) are equal to the equations (1) and (3), respectively. During the period T2, the third embodiment serves as the conventional delta value generating circuit and the amount of change of the delta value $N(n+1)-N(n)$ is as shown in FIG. 2. The result of the operation $N(n+1)$ is stored into the register 36 by the clock pulse supplied to the clock terminal 82 at a time point near the end of the period T2.

During the period T3, only the clock terminal CP3 is at logic 1, so that the clocked inverters 62-1 to 62-10 operates. The $\overline{Q}$ output signals of bits in the integration register 46 are respectively supplied as the Q output signals to the first input terminals A of the full-adders 60-1 to 60-10 of the lower ten bits through the clocked inverters 62-1 to 62-10. The inverted output signals $\overline{Q}$ of the D flip-flops 36-11 and 36-12 of the upper two bits of the register 36 for the delta value generation are supplied to the first input terminals A of the full-adders 60-11 and 60-12 of the upper two bits through the inverters 72 and 74, respectively. The control terminal UD is set at a level according to the codes of the coded bit train. If the code is at logic 0, the estimated value is larger than the input analog signal, the estimated signal is decreased, while when the code is at logic 1, the estimated signal is increased. The control terminal UD is set at logic 1 when the estimated signal is decreased, and is set at logic 0 when it is increased. During the period T3, the AND gate 96 is conductive, so that the control terminal UD is connected to the second input terminals B of the full-adders 60-7 to 60-12 of the upper six bits. The output terminal of the NAND gate 86 is at the same level as that at the control terminal UD.

When the data of the registers 46 and 36 are $E(n)$ and $N(n)$, the result $R(n)$ of the operation by the adder/subtractor 60, when the control terminal UD is at logic 0, is expressed by:

$$R(n) = (D1, D2, \ldots, D6, D7, D8, \ldots, D12) + \quad (16)$$

$$(\overline{d7}, \overline{d8}, \ldots, \overline{d12}, 0, 0, \ldots, 0) = E(n) + \frac{N(n)}{64}$$

When the control terminal UD is at logic 1:

$$R(n) = (D1, D2, \ldots, D6, D7, D8, \ldots, D12) \quad (17)$$

$$+ (\overline{d7}, \overline{d8}, \ldots, \overline{d12}, 1, 1, \ldots, 1)$$

$$+ 1$$

$$= E(n) - \frac{N(n)}{64}$$

From the equation (16) and (17), when the control terminal UD is at logic 0, the contents of the both registers 46 and 36 are added during the period T3. When the control terminal UD is at logic 1, the data in the register 36 is subtracted from the data in the register 46. The result of the operation is stored into the register 46 by the clock pulse supplied to the clock terminal 64 approximately when the period T3 terminates, as shown in FIG. 11D. The data in the register 46 is increased when the control terminal UD is at logic 0, and is decreased when it is at logic 1.

A case where the control terminal CTRL2 is at logic 1 will be described. In this case, when the control terminal EXD is at logic 1, the OR gate 126 is conductive, while when it is at logic 0, the OR gate 124 is conductive.

The operation during the period T1 is similar to that when the control terminal CTRL1 is at logic 1 level.

During the period T2, the adder/subtractor 60 arithmetically operates the delta value in the following manner in accordance with a level at the control terminal EXD.

When the control terminal EXD is at logic 1:

$$N(n + 1) = (d1, d2, \ldots, d6, d7, d8, \ldots, d12) \quad (18)$$

$$+ (\overline{d7}, \overline{d8}, \ldots, \overline{d12}, 1, 1, \ldots, 1)$$

$$+ 1$$

$$= N(n) + \frac{\overline{N(n)}}{64} + 1$$

$$= N(n) - \frac{N(n)}{64}$$

When the control terminal EXD is at logic 0:

$$N(n + 1) = (d1, d2, \ldots, d7, d8, d9, \ldots, d12) \quad (19)$$

$$+ (\overline{d6}, \overline{d7}, \ldots, \overline{d12}, 0, 0, \ldots, 0)$$

$$= N(n) + 127 - \frac{N(n)}{32}$$

$$= \frac{31}{32} N(n) + 127$$

The equations (18) and (19) are the same as the equations (9) and (11), respectively. Therefore, the third embodiment serves as the delta value generating circuit as in the second embodiment. The amount of change of the delta value is as shown in FIG. 7.

The operation during the period T3 is as in the case where the control terminal CTRL1 is at logic 1.

A case where the control terminal CTRL3 is at logic 1 will be described. When the control terminal EXD is at logic 1, the OR gate 124 is conductive, while when it is at logic 0, the OR gate 126 is conductive. The operation during the periods T1 and T3 is similar to that as mentioned above. During the period T2, the adder/subtractor 60 arithmetically operates the delta value in the following manner.

When the control terminal EXD is at logic 1:

$$N(n + 1) = (d1, d2, \ldots, d7, d8, d9, \ldots, d12) \quad (20)$$

$$+ (\overline{d6}, \overline{d7}, \ldots, \overline{d12}, 1, 1, \ldots, 1)$$

$$+ 1$$

$$= N(n) + \frac{\overline{N(n)}}{32} + 1$$

$$= N(n) - \frac{N(n)}{32}$$

When the control terminal EXD is at logic 0:

$$N(n + 1) = (d1, d2, \ldots, d6, d7, d8, \ldots, d12) + \quad (21)$$

$$(d7, d8, \ldots, d12, 0, 0, \ldots, 0) =$$

$$N(n) + 63 - \frac{N(n)}{64} = \frac{63}{64} N(n) + 63$$

The equations (20) and (21) are the same as the equations (5) and (7), respectively. During the period T2, the third embodiment serves as the delta value generating circuit as in the first embodiment, and the amount of change of the delta value is as shown in FIG. 5.

As described above, according to the present invention, the center of variation of the delta value may be changed by switching the levels at the control terminals CTRL1 to CTRL3, so that the adaptative delta demodulation well adaptable for the input analog signal is performed. Additionally, the delta value generating operation and the integration (estimate value generating operation) may be performed by the single adder/subtractor 60 by making use of the adder/subtractor 60 in a time-division fashion. Therefore, the number of the element can be reduced to ¾ that of the conventional one. The result is that in fabricating the circuit into an integrated circuit, the chip area is reduced with the improved integration density, and the manufacturing cost is reduced.

An application of a delta codec using the delta value generating circuit according to the present invention will be described. FIG. 13 shows a circuit diagram of a voice record/reproduction system. An output terminal of the oscillator 202 is connected to an inverted clock terminals $\overline{CK}$ of a frequency-dividing circuit 204 and a preset counter 206 and to clock terminals CK of D flip-flops 208 and 210 and connected to a clock terminal CK of a D flip-flop 214 through an inverter 212. The frequency-dividing circuit 204 and the preset counter 206 are each comprised of six D flip-flops series-connected. The Q output signals of the bits of the frequency dividing circuit 204 are connected to a reset terminal of a flip-flop 218 via a select circuit 216, and to one end of a switch 220. The other end of the switch 220 is connected to ground.

A key input terminal 222 to which a signal (logic 1) is supplied by an external key (not shown) operation. A key input terminal 223 to which a signal at a level according to an external key operated is connected to a data generator 226. An output terminal Q of the D flip-flop 208 is connected to an input terminal D of the D flip-flop 210, an inverter 224, and the data generator 226. An output terminal Q of the D flip-flop 210 and output terminal of the inverter 224 are connected to reset terminals R of the frequency-divider 204, data set terminals L of the preset counter 206 and an input terminal D of the D flip-flop 214. An output terminal Q of the D flip-flop 214 is connected to a set terminal of the flip-flop 218 and an inverted output terminal of the flip-flop 218 is connected through an inverter 229 to a delta codec 230 with an embodiment of the present invention. Output signals from the data generator 226 is supplied to data preset terminals D of the preset counter 206. Output signals of bits of the preset counter 206 are supplied to an address decoder 232, and an output from the address decoder 232 is supplied to an address terminal of a memory 234. An output signal from a microphone 236 is supplied to an analog input terminal of the delta codec 230 and the digital output terminal of the codec 230 is connected to the memory 234 and its analog output terminal is connected to a speaker 238.

The operation of the voice record/reproduction system thus constructed will be described. A feature of the system resides in that an random accessible element such as a semiconductor memory device is used for the memory 234, thereby allowing the data to simultaneously be reproduced. The operation of the system when the data is recorded will be described. Assume now that the delta codec 230 is set in a modulation mode and the memory 234 is set in a write mode. The memory 234 is made up of ten small areas each with eight addresses. By the external key, any one of the small area is selected and an input signal in accordance with the selected area is supplied from the key input terminal 223 to the data generator 226. For example, the first small area is selected. Through the key operation, the flip-flop 208 is also set. For this, the output signal from the NOR gate 228 is at logic 1 for one period of the output signal from the oscillator 202. The output signal (logic 1) from the NOR gate 228 resets the frequency-dividing circuit 204. The data generator 226 produces data 0, for example, in accordance with the keying input, to the preset counter 206. When the second small area is selected, the data 8, is set. The preset counter 206 reads in the data 0 in accordance with the output signal of the NOR gate 228. Then, the frequency divider 204 and the preset counter 206 perform the count operation at the trailing edge of the output pulse signal from the oscillator 202.

The select circuit 216 connected to the output of the frequency-divider 204 is comprised of switches connected to the output terminals of the bits of the frequency divider 204, and any one of the switches is closed while the remaining ones are opened. Only the output signal of the bit corresponding to the closed switch is selected to determine a frequency dividing ratio of the frequency divider 204. In this example, the frequency dividing ratio is set at ⅛.

When the output signal from the NOR gate 228 raises to logic 1, the flip-flops 214 and 218 are set. As a result, the output terminal of the inverter 229 is at logic 1. Then, the delta codec 230 starts to operate to encode the input voice signal from the microphone 236 for transmission to the memory 234. The coded data are successively stored into the memory locations from the address 0 to the subsequent ones of the memory 234.

When the frequency divider 204 counts eight pulses produced from the oscillator 202, the flip-flop 218 is reset and the output terminal of the inverter 229 is at logic 0 to stop the operation of the delta codec 230. Until the stop of the operation of the delta codec 230, the preset counter 206 counts seven pulses. Accordingly, the output data from the address decoder 232 is the "initial value +7", i.e. 7, and the data stored in the memory 234 is only the memory locations up to only the address 7. Subsequently, when the small area from 2 to 10 are selected by the key, the data generator 226 sets the initial data dependent on the small areas selected into the preset counter 206. Then, the data write is started from the address corresponding to the selected area, and the one data is written into the successive eight addresses.

When the coded data is read out from the memory 234 and reproduced, the read out of the signal from a proper address through the external key starts.

As described above, according to the system, the initial value in the address of the memory is set by the operating the external key, and when the access is made to a given address, the frequency divider produces an output signal by which the operation of the codec is stopped. In this way, a desired data can simultaneously be reproduced.

What we claim is:

1. An adaptive delta codec comprising:
    delta coding means which compares the level of an analog input signal and an estimated signal, and generates a coded signal in response to the result of the comparison;
    first and second control terminals which receive control signals indicative of the increase or decrease in a delta signal and the estimated signal;
    first and second storing means for respectively storing the delta signal and the estimated signal;
    adder/subtractor means connected to said first and second storing means in time-division manner, and which decreases an absolute value of the estimated signal in the second storing means during a first time period, changes the delta signal in said first storing means in accordance with the level at said first control terminal during a second time period, and makes an addition or subtraction of the delta signal and the estimated signal in accordance with the level at said second control terminal during a third period, the result of the addition or subtraction in the third period being stored in the second storing means as a new estimated signal.

2. An adaptive delta codec according to claim 1, in which an output terminal of said first storing means is connected to a first input terminal of said adder/subtractor means, said first control terminal is connected to a predetermined number of upper bits of a second input terminal and an operation indicating terminal of said adder/subtractor means, and the predetermined number of upper bits of the output terminal of said first storing means and said first control terminal are connected to the remaining bits of said second input terminal of said adder/subtractor means in accordance with the level at said first control terminal during the second time period.

* * * * *